United States Patent [19]
Takahashi

[11] Patent Number: 5,969,882
[45] Date of Patent: Oct. 19, 1999

[54] CATADIOPTRIC OPTICAL SYSTEM

[75] Inventor: Tomowaki Takahashi, Yokohama, Japan

[73] Assignee: Nikon Corporation, Tokyo, Japan

[21] Appl. No.: 09/052,481

[22] Filed: Mar. 31, 1998

[30] Foreign Application Priority Data

Apr. 1, 1997 [JP] Japan .................................. 9-083151
Oct. 6, 1997 [JP] Japan .................................. 9-290357

[51] Int. Cl.$^6$ .................................................. G02B 17/08
[52] U.S. Cl. .......................... 359/728; 359/364; 359/726; 359/727
[58] Field of Search .................................. 359/364, 708, 359/726–728, 730, 737–739, 627

[56] References Cited

U.S. PATENT DOCUMENTS 5,835,284 11/1998 Takahashi et al. ...................... 359/726

*Primary Examiner*—Georgia Epps
*Assistant Examiner*—David N. Spector
*Attorney, Agent, or Firm*—Chapman and Cutler

[57] ABSTRACT

In a catadioptric optical system, the first focusing lens system A includes a concave mirror Mc, and it forms an intermediate image of the first plane R. The second focusing lens system B includes an aperture stop AS, and it forms a refocused image of the intermediate image on the second plane W. A reflecting surface $M_{P1}$ is placed so that the light flux leaving the first focusing lens system A is guided to the second focusing lens system B. There are one or more lens surfaces that satisfy the condition $$h/\phi < 0.85 \tag{1}$$

and one or more lens surfaces that satisfy the condition $$0.85 < h/\phi < 1.2 \tag{2}$$

where h is the height at each lens surface of the light beam that is assumed to be emitted from the intersection of the optical axis of the first plane and passes through the lens surfaces with the maximum numerical aperture, and φ is the radius of the diaphragm of the aperture stop. At least one of the lens surfaces that satisfy condition (1) and at least one of the lens surfaces that satisfy condition (2) are aspheric. The first aspheric element is placed near the intermediate image, while the second aspheric element is placed near the concave mirror or the aperture stop. The concave mirror itself may be formed as a second aspheric element.

23 Claims, 17 Drawing Sheets

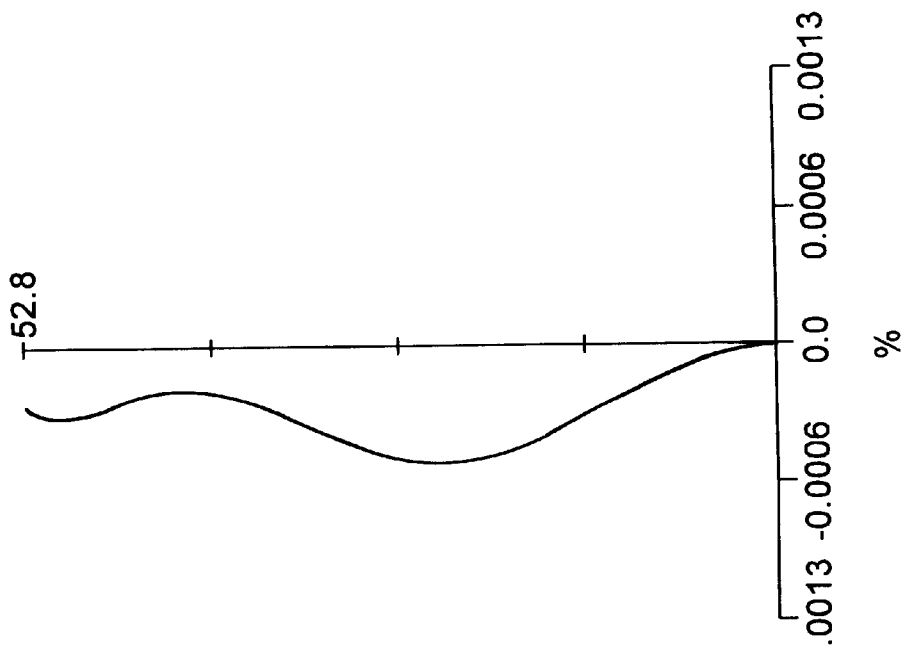
FIG. 5A ASTIGMATIC FIELD CURVES
FIG. 5B DISTORTION

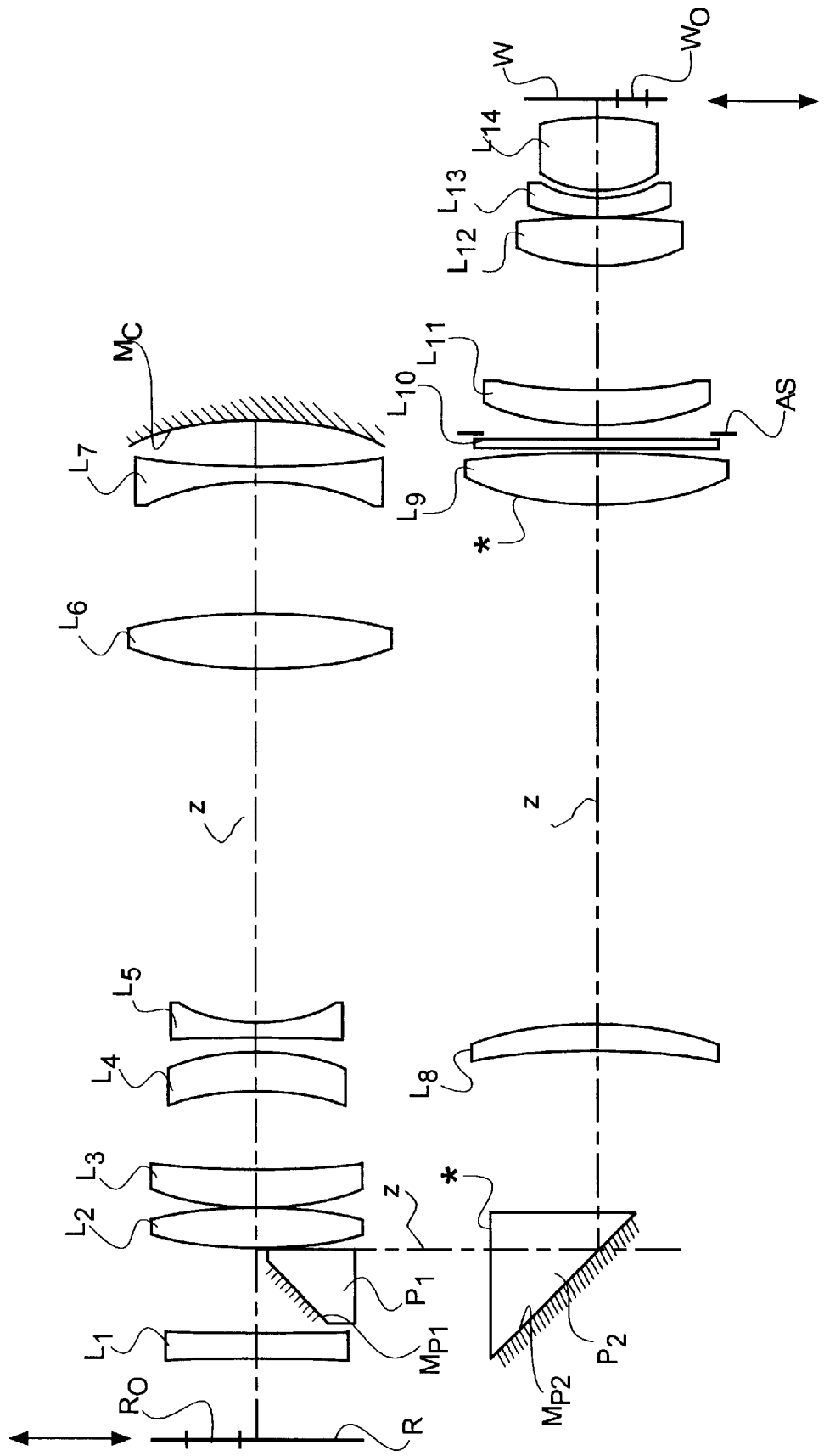

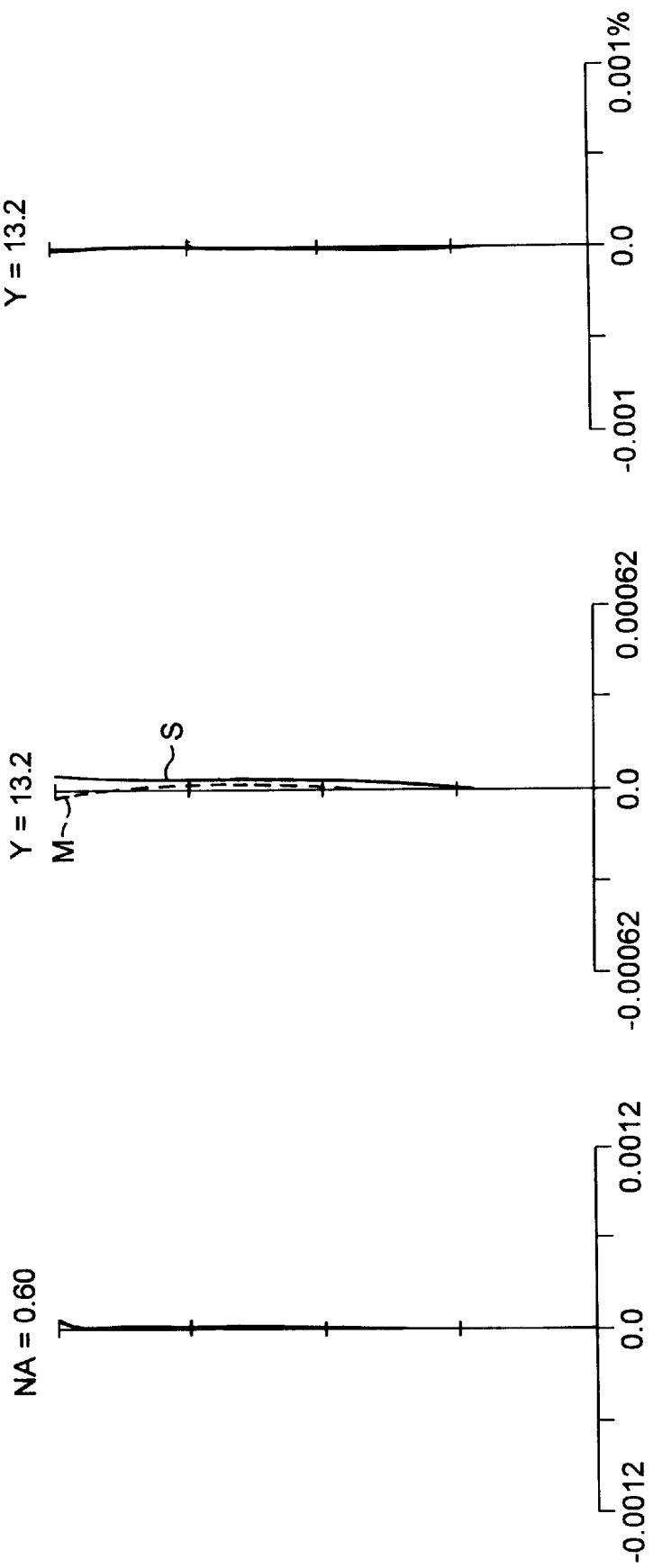

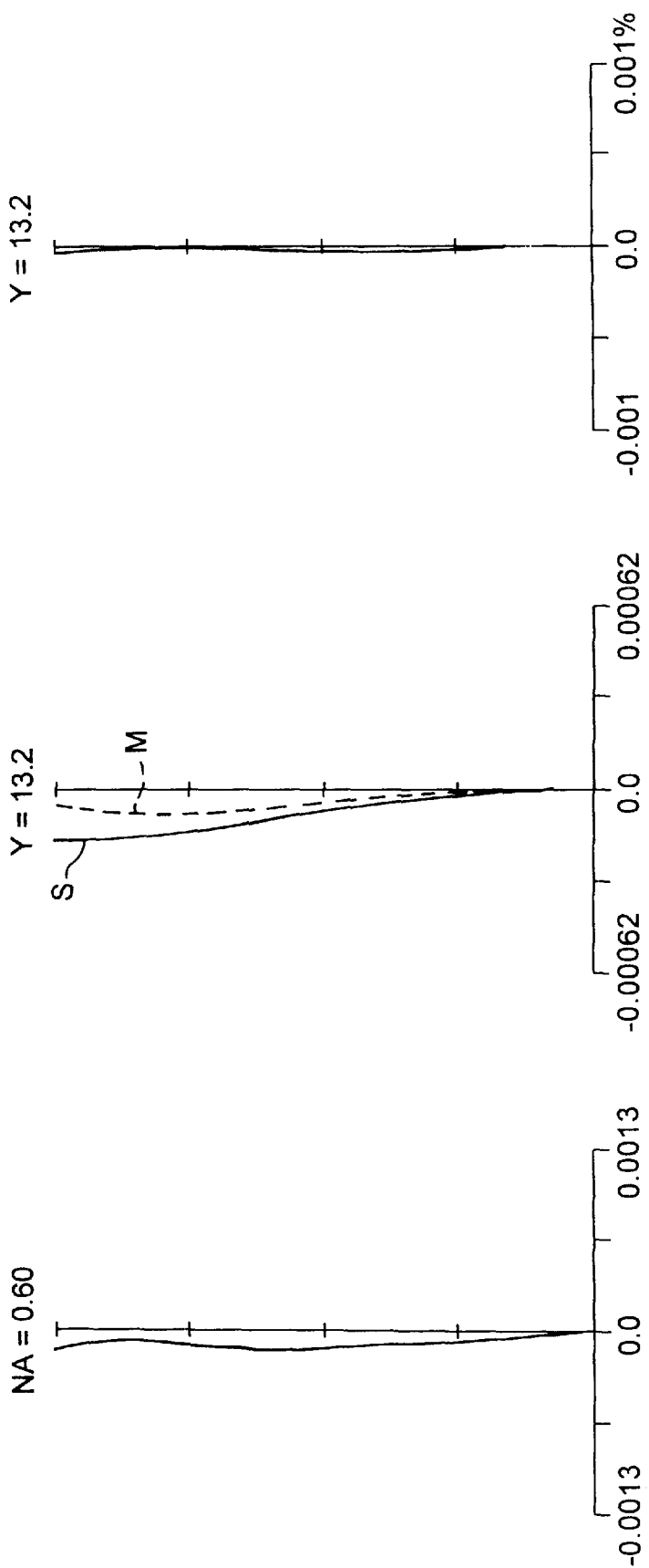

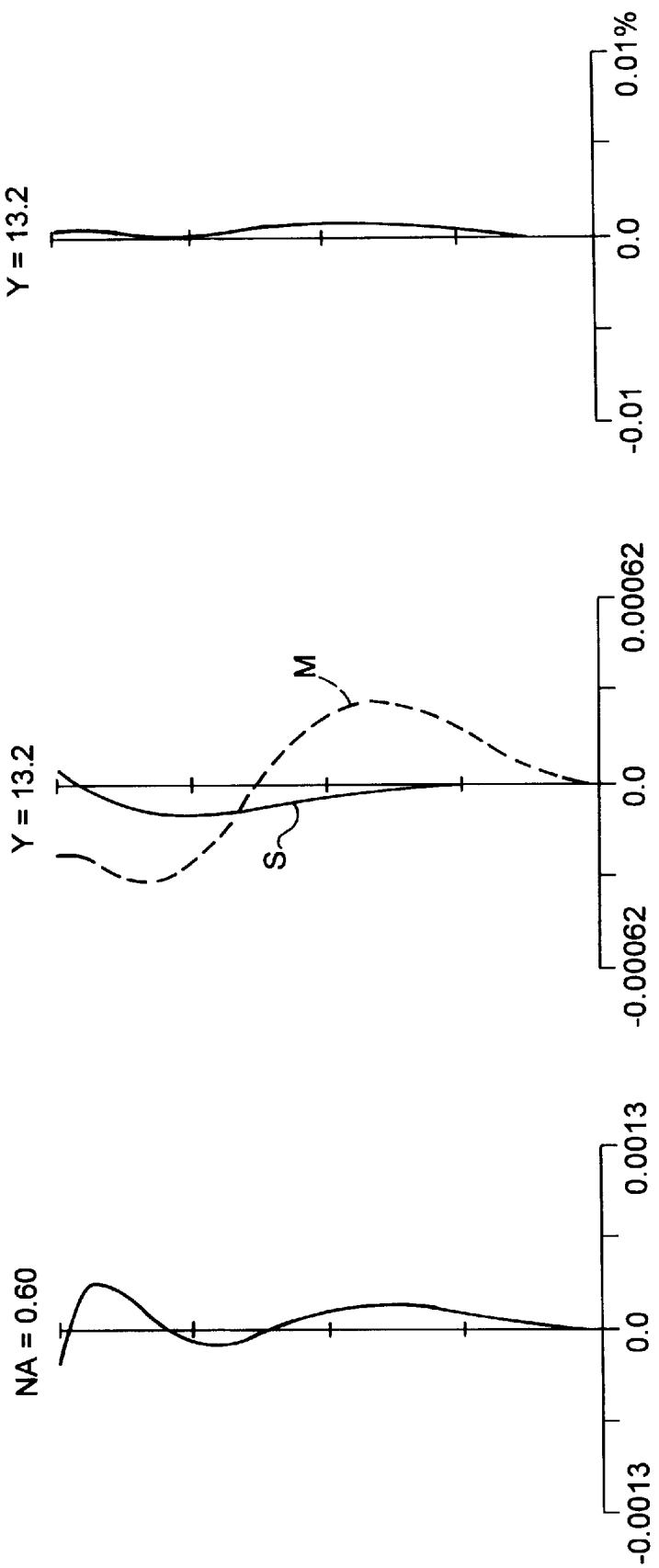
FIG. 16A SPHERICAL ABERRATION
FIG. 16B ASTIGMATISM
FIG. 16C DISTORTION

CATADIOPTRIC OPTICAL SYSTEM

BACKGROUND OF INVENTION

1. Field of Invention

This invention relates to an optical system for a reducible exposure apparatus, such as a stepper, used for manufacturing semiconductor devices, and more particularly, to a scanning type catadioptric reducible optical system having a magnification of ¼ to ⅕ and a high resolution in the ultraviolet frequency band.

2. Description of Related Art

In recent years, semiconductor circuit patterns have become more and more minute, and a demand has arisen for a high-resolution exposure apparatus that is capable of printing such minute patterns.

In order to realize a high-resolution exposure apparatus, the wavelength of the light source must be shortened and, at the same time, the numerical aperture (NA) of the optical system must be increased. However, if the wavelength is shortened, the types of optical glass that can be practically used in the exposure apparatus are very limited because of light absorption. In fact, with a wavelength of 300 nm or less, only synthetic quartz and fluorite can be practically used.

Unfortunately, however, the Abbe constants of the synthetic quartz and fluorite are too close to each other to sufficiently compensate for the chromatic aberration in the system. For this reason, if the wavelength of the light source is shortened to 300 nm or less, it becomes difficult for the projection-optical system that comprises only a refracting optical system to satisfactorily correct the chromatic aberration. In addition, the refractivity of fluorite easily changes in response to a temperature change because of its inferior temperature characteristic. Fluorite also has several problems in the lens grinding process. Thus, it is not easy to achieve a high-resolution exposure apparatus only with a refracting optical system.

On the other hand, many attempts have been made to design the projection-optical system using only a reflecting optical system. In this case, the projection-optical system becomes large in size, and the reflecting surfaces must be made aspheric. It is difficult to form an aspheric surface at a high precision.

In view of these drawbacks, it was proposed to combine a reflecting system and a refracting system made of an optical glass durable to the designated wavelength. Also, many techniques for constructing a reducible projection-optical system using a reflecting/refracting, or catadioptric, optical system have been proposed. Among them, many systems form two or more intermediate images in their optical system. Meanwhile, techniques for forming only one intermediate image in the optical system are disclosed in Japanese Patent Publication No. 5-25170, the Japanese Patent Application Laid-open Nos. 63-163319 and 4-234722, and U.S. Pat. No. 4,779,966.

In particular, Japanese Patent Application Laid-open No. 4-234722 and U.S. Pat. No. 4,779,966 disclose optical systems that use only one concave mirror. The concave mirror is used in the double path lens system which comprises only concave lenses, without using convex power lenses. In this structure, the light flux is apt to diverge when it strikes the concave mirror and, therefore, the diameter of the concave mirror inevitably increases.

The double path lens system disclosed in Japanese Application 4-234722 is perfectly symmetric for the purpose of preventing aberrations as much as possible in this lens system, and of reducing the burden of aberration correction on the subsequent optical system. However, it is difficult for the symmetric optical system to obtain an adequate working distance near the first plane and, therefore, a half prism must be used.

The optical system disclosed in U.S. Pat. No. 4,779,966 uses a mirror in the secondary focusing optical system positioned behind the intermediate image. In this arrangement, the light flux can not be narrowed because adequate brightness must be required for the optical system, and the divergent light flux strikes the concave mirror surface. For this reason, it is difficult to make the mirror smaller.

If a plurality of mirrors is used, the number of lenses in the refracting optical system can be reduced. However, this type of system has other potential problems.

One problem is that if this type of catadioptric optical system is used as an objective lens, there is no effective diaphragm position in this catadioptric optical system. That is, recent phase-shift techniques allow the phase of a selected area on the mask to be shifted in order to improve the resolution, while achieving a sufficient amount of focal depth. For further improvement of the resolution, the NA ratio σ of the illumination-optical system to the focusing-optical system is made variable by providing aperture stops in both systems. However, in the above-mentioned multiple-mirror system, an aperture stop can be positioned only in the illumination-optical system, and there is no place for a diaphragm in the catadioptric optical system which serves as the objective lens of the apparatus.

If a multiple-mirror type double path lens system is positioned near the second plane on the reduction side (i.e., on the wafer side) in the catadioptric optical system, the distance from the reflecting mirror to the wafer becomes insufficient because of the magnification of less than 1. To avoid this, the number of lenses used in the objective lens must be reduced, which causes the optical system to darken. Even if a high NA is achieved, many lens components must be inserted in a limited path and, as a result, the working distance (WD) between the last lens surface of the objective lens and the wafer becomes insufficient.

Another problem in the conventional catadioptric optical system is that the optical axis must be decentered in the middle of the optical path using a decentering lens system, and that precise adjustment of the degree of decentering is very difficult.

The assignee of the present invention proposed a double-focusing optical system with first and second focusing lens systems in a different publication. In this system, the first focusing lens system has a double path lens system comprising a concave mirror and a lens group through which both the incident light to and exit light from the concave mirror pass. The first focusing lens system forms an intermediate image of the first plane (the mask plane), and the second focusing lens system forms that intermediate image on the second plane. A reflecting surface is provided so as to guide the light flux from the first focusing lens system onto the second focusing lens system.

This double-focusing optical system can reduce the diameter of the concave mirror, and has a variable NA ratio σ of the illumination-optical system to the projection-optical system with effective diaphragm positions in both systems. The entire optical system is adequately bright, while the working distance (WD) between the wafer and the end face of the object lens is sufficiently long. In addition, the adjustment of the decentering part in the decentering lens system is simplified, and a highly precise optical system is achieved.

Notwithstanding the advantages, this optical system is likely to become large if still higher image quality is demanded. This optical system does not have a symmetric structure and, accordingly, distortion is likely to arise. Especially, higher order distortion can not be corrected only by adjusting the curvature of the refractive lens or the lens space, and the entire system must be enlarged in order to satisfactorily compensate for the distortion.

SUMMARY OF THE INVENTION

Therefore, it is an object of this invention to provide a compact catadioptric optical system which can reduce the number of lenses used in the lens system, while keeping a high image quality.

In order to achieve the object, the catadioptric optical system according to the present invention comprises a first focusing lens system A, a second focusing lens system B, and a reflecting surface for guiding the light flux from the first focusing lens system to the second focusing lens system. The first focusing lens system A includes a concave mirror Mc, and it forms an intermediate image C of the first plane. The second focusing lens system B includes an aperture stop AS, and it forms a refocused image of the intermediate image onto the second plane W. As a feature, this catadioptric optical system includes one or more lens surfaces that satisfy the following condition:

$$h/\phi < 0.85 \tag{1}$$

where h is the height at each lens surface of the light beam that is assumed to be emitted from the intersection of the optical axis and the first plane and passes through the lens surfaces with the maximum numerical aperture, and $\phi$ is the radius of the diaphragm of the aperture stop. The catadioptric optical system also includes one or more lens surfaces that satisfy the condition $$0.85 < h/\phi < 1.2 \tag{2}$$

Among these lens surfaces, at least one of the lens surfaces that satisfy condition (1) and at least one of the lens surfaces that satisfy condition (2) are aspheric.

Thus, at least two aspheric surfaces are provided at appropriate positions, which allows the number of lenses to be decreased, while keeping a high image quality. The entire optical system can also be made compact.

The reflecting surface separates the advancing light flux toward the concave mirror in the forward path from the return light flux from the concave mirror in the return path. Because of this separation of the forward and return light fluxes, the light beam must pass through the object plane and the image plane at a certain height from the optical axis, and the area defined by such a light beam having a certain height is the actually used area. The area where the image height and the object height is zero is not used in practice. The wording "the light beam that is assumed to be emitted from the intersection of the optical axis and the first plane" implies that such a light beam is not actually used in this optical system.

In general, an aspheric surface exhibits a single effect in an optical system depending on its shape, and the position where the aspheric surface is placed in that optical system is very important.

Because of its single effect characteristic, one aspheric surface is very effectively used to correcting one type of aberration, but it is not so useful to correct some other aberrations at the same time. If the use or the position of the aspheric surface is wrong, the effect is extremely reduced, or the aspheric surface itself may become an obstacle.

In general, a spherical surface is positioned near the object plane or an image plane in order to correct the distortion, which is the major off-axis aberration, without affecting other aberrations, such as spherical aberration and coma. This can be achieved by other than the single effect characteristic of the aspheric surface, because of the fact that the light flux is converging near the object plane and the image plane and, therefore, the spherical aberration and the coma are rarely affected by this specific aspheric surface placed near these planes. However, the astigmatism is partially affected by the aspheric surface because it is associated with deviation from the image plane.

It is difficult for an ordinary optical system to place an aspheric surface having a function of correcting the off-axis aberration very close to the object plane or the image plane. Accordingly, such an aspheric surface is carefully placed as close to the object or image plane as possible, and far from the aperture stop.

In contrast, in the present invention, an intermediate image of the object plane is formed, and an aspheric surface for correcting the off-axis aberration is simply placed on or near this intermediate image. In this arrangement, the aspheric surface can exhibit its maximum effect.

Condition (1) defines the optimum position of the aspheric surface for correcting the off-axis aberration. Above the upper limit of this range, the relation between the beam heights at the object plane and the aspheric surface becomes weak and, consequently, it becomes difficult to correct only the off-axis aberration satisfactorily.

In order to correct the spherical aberration, which is the major on-axis aberration, another aspheric surface having a shape suitable to correcting the spherical aberration is placed near the aperture stop. Again, because of the single effect characteristic, the spherical aberration is efficiently corrected without affecting astigmatism and distortion. The fact that the principal ray of the light flux passes through the aperture stop on or near the optical axis can also prevent the astigmatism and the distortion from being affected by the aspheric surface placed near the aperture stop. However, the coma is partially affected by this aspheric surface because it is associated with the size of the lens aperture.

In the present invention, as shown in FIG. 2, a first aspheric element P is positioned near the intermediate image C, and a second aspheric element Q is positioned near the concave mirror M1, or the aperture stop S. The aperture stop is positioned in the second focusing lens system, and the aspheric surface having a function of correcting the on-axis aberration can be placed near the aperture stop, exhibiting its maximum effect. Or alternatively, the concave mirror M1 may be made aspheric so as to serve as the second aspheric element Q.

The aspheric surface for correcting the on-axis aberration may be placed near the concave mirror of the first focusing lens system. This arrangement can also achieve the same effect. Accordingly, if it is not desirable to place the aspheric surface near the aperture stop because of the mechanical limitation of the aperture stop depending on the system, then the aspheric surface is placed near the concave mirror, instead of placing it near the aperture stop. In this case, it should be noted that the light flux passes through this aspheric surface twice along its forward and return paths and, therefore, the change in the shape of the aspheric surface affects the light flux double.

Condition (2) defines the optimum position of the aspheric surface having an ability of correcting the on-axis aberration. Below the lower limit of the range, the relation between the angle of the light beam (i.e., the numerical aperture) that exits the object and the beam height at the aspheric surface becomes weak, and it becomes difficult to correct only the on-axis aberration satisfactorily. Above the upper limit, the lens diameter becomes too large, which contradicts the object of the invention.

Because, in the present invention, at least two aspheric surfaces having appropriate shapes are placed in at least two places suitable to the respective purposes, the distortion, which is the major off-axis aberration, and the spherical aberration, which is the major on-axis aberration, can be corrected at the same time.

These aspheric surfaces can correct only the target aberrations without adversely affecting other aberrations, unlike the conventional aspheric focusing lens system. This results in reduced number of lens components, and a compact optical system can be achieved. Thus, the minimum number of aspheric surfaces achieve the maximum effect.

Additional aspheric surfaces having different shapes may be inserted in the optical system for the purpose of correcting remaining aberrations, such as the coma and the astigmatism. Since the major on-axis and off-axis aberrations have been corrected in this case, other aberrations can be corrected easily. By adding aspheric surfaces, the total number of lenses can be reduced.

The aspheric surface for correcting the off-axis aberration and the aspheric surface for correcting the on-axis aberration may be independent aspheric lenses or aspheric concave mirror, or alternatively, they may be formed on the end face or the reflecting surface of a prism, the reflecting surface of a plane mirror, or the surface of a plane-parallel plate.

The shape of the aspheric surface may be symmetric about the rotational axis, or toric, or completely asymmetric.

BRIEF DESCRIPTION OF THE DRAWINGS

The above and other objects, features, and advantages of the invention will be apparent from the detailed description which follows by way of exemplary embodiments of the invention with reference to the attached drawings, which are here described:

FIG. 5 shows the astigmatic field curvature and the distortion in the first embodiment;

FIG. 9 shows the lens arrangement according to the third embodiment of the invention;

FIG. 10 shows the spherical aberration, the astigmatism, and the distortion in the third embodiment;

FIG. 13 shows the spherical aberration, the astigmatism, and the distortion in the fourth embodiment;

FIG. 16 shows the spherical aberration, the astigmatism, and the distortion in the fifth embodiment.

DETAILED DESCRIPTION OF THE PREFERRED EMBODIMENTS

The preferred embodiments of the invention will now be described in detail with reference to the attached drawings.

Figure 1:
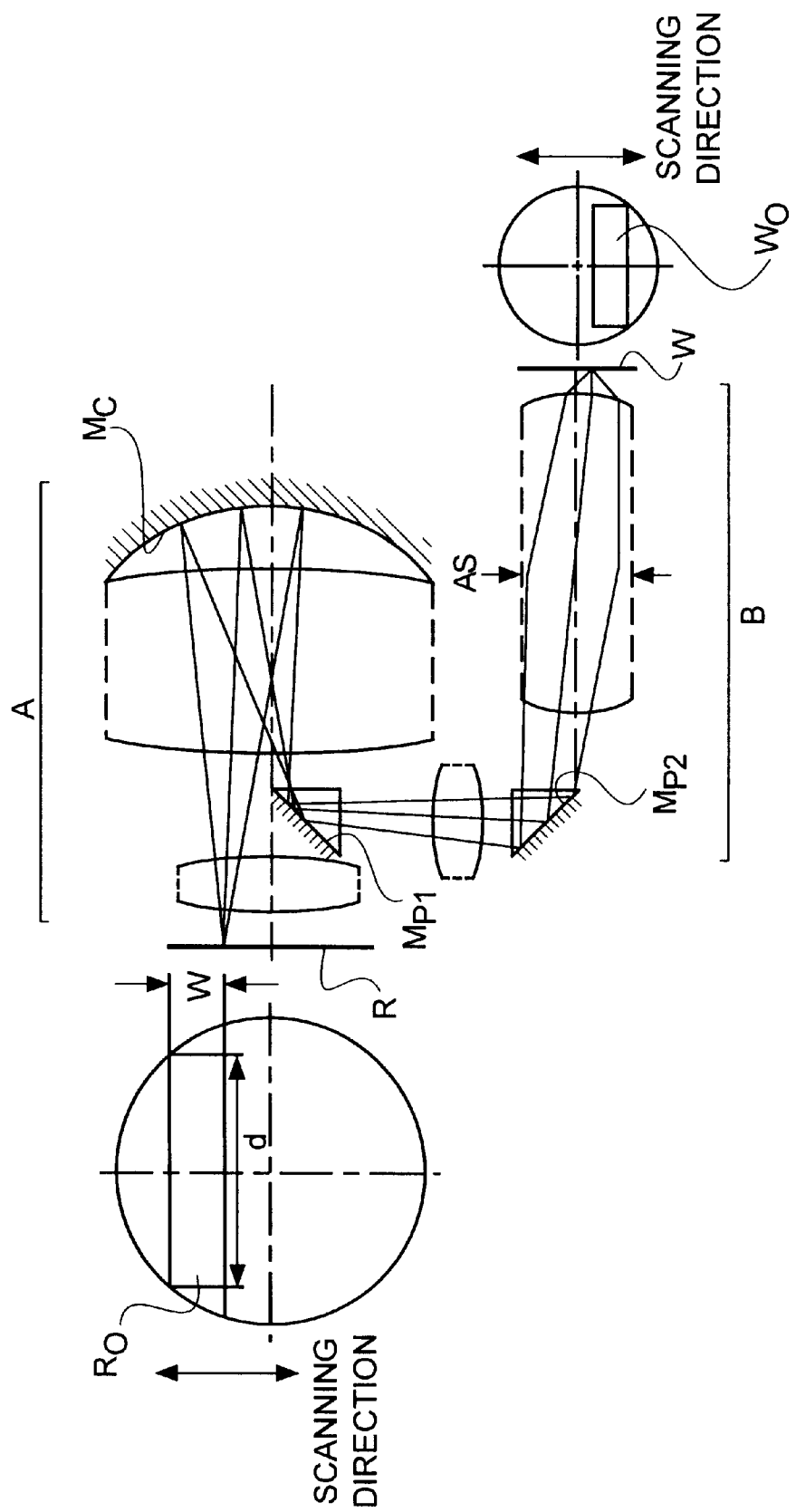
FIG. 1 shows the structure of the catadioptric optical system according to the invention.

FIG. 1 shows the structure of the catadioptric optical system of the present invention. In this embodiment, the present invention is applied to a reducible projection-optical system for transferring the circuit pattern on the reticle R (as the first plane) onto the semiconductor wafer W (as the second plane) at a magnification of less than 1. This projection-optical system comprises a first focusing lens system A, which is used to form an intermediate image of the circuit pattern formed on the reticle R, and a second focusing lens system B for forming a refocused image of the intermediate image on the wafer W. The first focusing lens system A has a concave mirror Mc, and the second focusing lens system B has an aperture stop AS. A first reflecting surface $M_{P1}$ is placed near the intermediate image. This reflecting surface $M_{P1}$ bends the optical axis Z by 90 degrees, thereby guiding the light flux from the first focusing lens system A to the second focusing lens system B. A second reflecting surface $M_{P2}$ is placed between the first reflecting surface $M_{P1}$ and the aperture stop AS. The second reflecting surface $M_{P2}$ further bends the optical axis Z by 90 degrees so that the optical axis Z on the reticle R and the optical axis Z on the wafer W becomes parallel to each other. The second reflecting surface $M_{P2}$ may be omitted optionally.

In this projection-optical system, the light flux is separated into two parts by the first reflecting surface $M_{P1}$, namely, the flux entering the concave mirror Mc, and the flux leaving the concave mirror Mc. Because of this arrangement, the sub-areas on the reticle R and the wafer W that contain the optical axis Z are not used for the pattern transfer. In other words, the slit-like sub-areas on the reticle R that do not contain the optical axis Z are used as the illumination areas Ro, and the slit-like sub-areas on the wafer W that do not contain the optical axis Z are used as the exposure area Wo. By scanning the slit-like sub-areas Ro and Wo in the direction "w" along the width of the slit, the reticle pattern contained in that slit-like area is transferred onto the wafer. Although, in FIG. 1, the sub-area is a slit-like rectangle with a width "w" and a length "d", the shape of the sub-area is not limited to this example, and any shapes that are formed by translating an arbitrary line or curve (e.g., an arc) in the scanning direction by "w" can be used.

Figure 2:
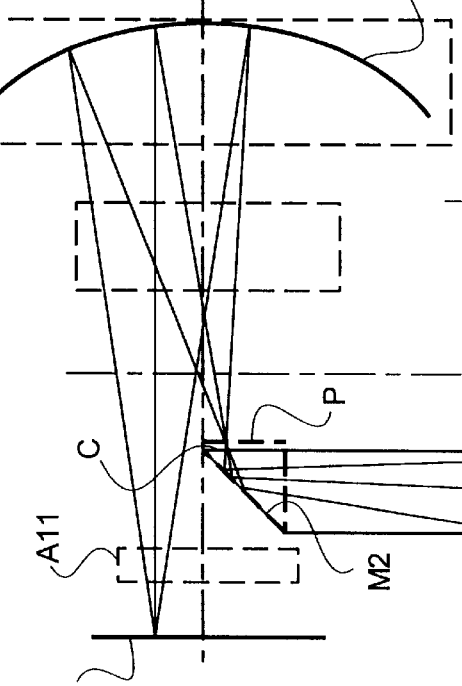
FIG. 2 shows the structure of the catadioptric optical system having two aspheric elements according to the invention.

FIG. 2 shows the structure of the catadioptric optical system having two aspheric surfaces. The present invention employs a so-called twice-focusing lens system, in which an intermediate image C is formed during projecting the pattern image of the first plane R onto the second plane W. The twice-focusing system using a concave mirror allows the Petzval sum and the chromatic aberration to be compensated effectively. For the further correction of aberrations, aspheric surfaces are placed at specific positions.

A second aspheric surface Q is placed near the aperture stop S, whereby the spherical aberration and the coma can be corrected without affecting the aberrations associated with the angle of view (e.g., distortion and astigmatism). This is because the principal ray of the light flux passes through the center of the diaphragm and, therefore, the principal ray is not affected by the shape of any aspheric surface. In contrast, since all the light fluxes that left the first plane R on or off the optical axis always pass through the entire region of the aperture stop S, these light fluxes are uniformly subjected to the refractive effect.

Besides the position near the aperture stop S in the second focusing lens system B, the position near the concave mirror M1 in the first focusing lens system A is also used to correct the aberrations associated with the incident height, independent of other aberrations. When placing an aspheric element near the concave mirror M1 of the first focusing lens system A, a plane-parallel plate whose surface is ground into an aspheric surface, or an independent aspheric lens may be used. Alternatively, the concave mirror M1 itself may be made as an aspheric concave mirror.

A first aspheric surface P is placed near the intermediate image C, whereby the distortion and the astigmatism can be corrected without affecting the aberrations associated with the incident height (e.g., spherical aberration and coma). This is because the light flux converges near the intermediate image C and, therefore, the peripheral fluxes that left the first plane R on or off the optical axis are not affected by the aspheric shape located near the intermediate image. In contrast, all of the principal rays are subjected to the refractive effect due to the aspheric surface.

When placing the first aspheric element P near the intermediate image C, an independent aspheric lens may be used or, alternatively, the end surface of a prim or a plane-parallel plate may be ground into an aspheric surface. Furthermore, the reflecting surface of a light-flux splitting mirror or a prism positioned near the intermediate image C may be ground into the aspheric surface.

Regular lenses, as well as plane-parallel plates, can be used as the aspheric elements in the present invention. The first aspheric element P may be a prism if a second reflecting surface M2 for deflecting the optical path is provided in the system.

In order to make the entire twice-focusing optical system compact, it is preferable to provide the second reflecting surface M2 for deflecting the optical path on or near the intermediate image C. The second reflecting surface M2 is, for example, the reflecting surface of a mirror or a prism.

In addition, it is preferable for the first focusing lens system A to comprise a one-way lens system A11, along which the incident light strikes the concave mirror M1, and a double path lens system A12, along which pass both the forward beam incidental to the concave mirror M1 and the return beam reflected from the concave mirror M1. This means that the first focusing lens system A is not used at a magnification of 1, whereby the distortion and the coma arising in the second focusing lens system B are satisfactorily corrected.

The one-way lens system A11 has a negative refractive power, so that the light flux incidental to the double path lens system A12 does not overlap with the light flux leaving the double path lens system A12.

A third reflecting surface M3 is placed between the second reflecting surface M2 and the second focusing lens system B in order to deflect the optical path. Preferably, the first plane R and the second plane W are parallel to each other. By placing the third reflecting surface M3, the optical system is folded twice and, as a result, the entire system becomes compact. By arranging the first plane R and the second plane W in parallel, the optical axes of the optical elements that are positioned out of the range between the second and third reflecting surfaces M2 and M3 align in one direction. This arrangement can prevent asymmetric deformation of optical elements, whereby a highly precise optical system is achieved in the manufacturing process. In all the embodiments of the invention, there exists between the second and third reflecting surfaces M2 and M3 and, accordingly, the optical axes of all of the optical elements align in one direction, whereby an optical system with a higher degree of precision is achieved.

Preferably, the first aspheric surface P is rotationally symmetric, toric, or perfectly asymmetric, and the second aspheric surface Q is rotationally symmetric.

The actual examples of the catadioptric optical system according to the invention will be shown below.

$SiO_2$ used as the glass material has an index of refraction of 1.50839 with respect to the light having a wavelength of 248 nm. Although, in the embodiments, only $SiO_2$ is used as the glass material, $CaF_2$ can also be used.

[First Embodiment]

Figure 3:
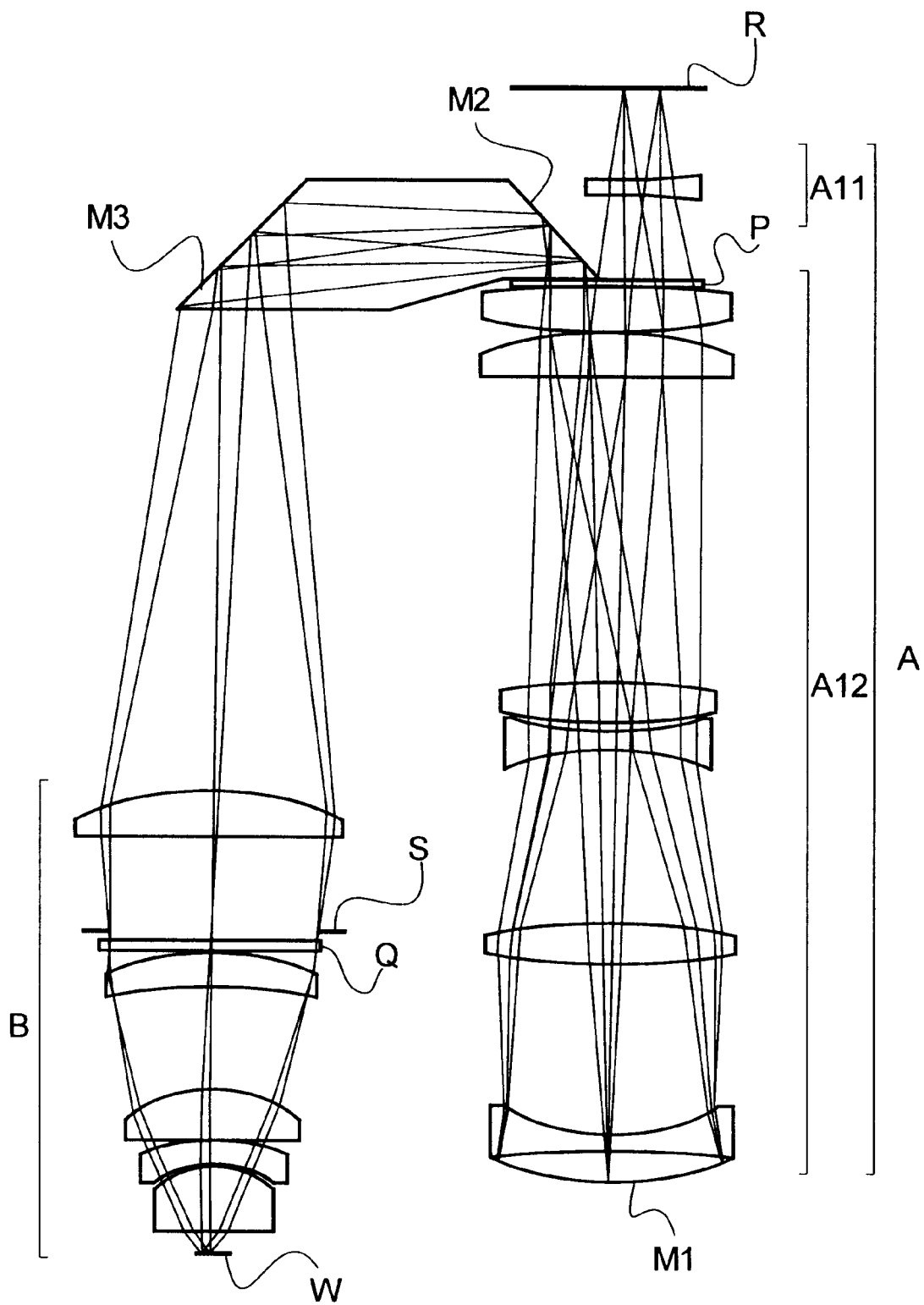
FIG. 3 is a ray diagram of the catadioptric optical system according to the first embodiment of the invention.
Figure 4A:
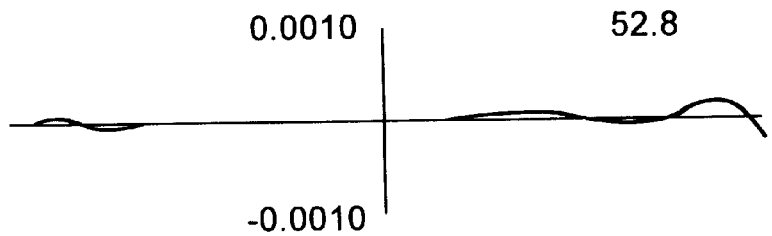
FIG. 4 shows the transverse aberration arising in the first embodiment.
Figure 4B:
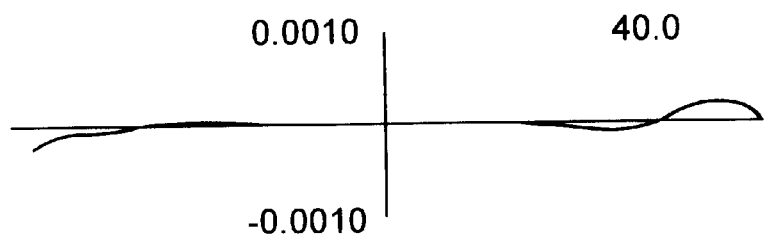
Figure 4C:
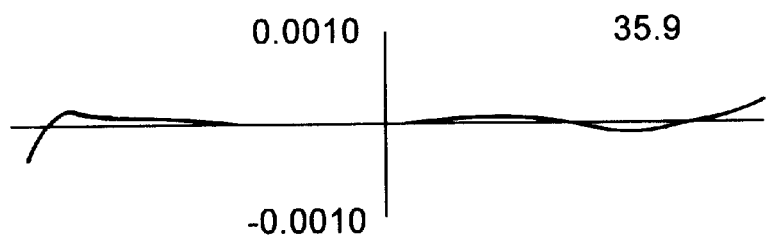
Figure 4D:
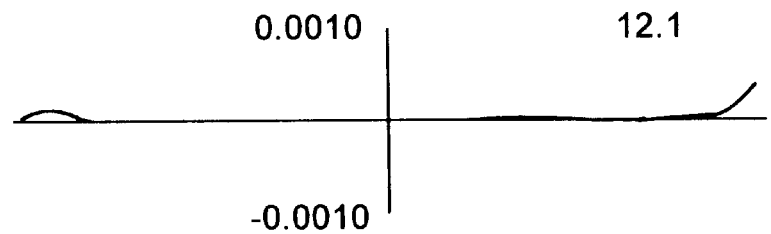

FIG. 3 is a ray diagram of the catadioptric optical system according to the first embodiment, and Table 1 lists the lens data of this optical system. In Table 1, the first column lists all the lens surfaces serially numbered, the second column is the radius of curvature of each lens surface, the third column is the distance to the next lens surface, and the fourth column indicates the glass material. Specific elements are denoted by the symbols used in this specification.

The catadioptric optical system of this embodiments has a first focusing lens system A which consists of a one-way lens system A11 comprising a refractive lens, and a double path lens system A12 comprising six lenses, a concave mirror M1, and a plane-parallel plate (i.e., a first aspheric element P) having an aspheric surface. The light beam that left the first plane R passes through these element in this order. The light beam is then reflected by the light-flux splitting mirror, which serves as the second reflecting surface M2, and the bending mirror, which serves as the third reflecting surface M3. The beam further passes through the second focusing lens system B which comprises five lenses and a plane-parallel plate (i.e., a second aspheric element Q) having an aspheric surface and, finally, it reaches the wafer (i.e., the second plane) W. An intermediate image C of the reticle R is formed near the light-flux splitting mirror.

The magnification of this optical system is ¼, the numerical aperture NA on the image side is 0.6, and the maximum object height is 52.8. This optical system has a rectangular aperture with an exposure size of 55×90, and the reticle pattern is exposed to the light beam, while the reticle is scanned with respect to the light beam.

TABLE 1

| NO. | r | d | glass material | | |
|---|---|---|---|---|---|
| 0 | 0.00000 | 60.000 | | R | |
| 1 | −639.93122 | 10.935 | $SiO_2$ | A | A11 |
| 2 | 638.79323 | 63.097 | | | |

TABLE 1-continued

| NO. | r | d | glass material | |
|---|---|---|---|---|
| 3 | 772.20352 | 30.000 | SiO$_2$ | A12 |
| 4 | −534.73642 | 0.081 | | |
| 5 | 285.29345 | 30.000 | SiO$_2$ | |
| 6 | −5948.04836 | 206.478 | | |
| 7 | 501.06370 | 30.000 | SiO$_2$ | |
| 8 | −309.92623 | 5.000 | | |
| 9 | −251.33100 | 11.810 | SiO$_2$ | |
| 10 | 168.56869 | 117.942 | | |
| 11 | 321.57847 | 30.000 | SiO$_2$ | |
| 12 | −464.57044 | 115.331 | | |
| 13 | 161.47861 | 12.000 | SiO$_2$ | |
| 14 | 765.45803 | 20.000 | | |
| 15 | −244.06677 | −20.000 | reflecting surface M1 | |
| 16 | 765.45803 | −12.000 | SiO$_2$ | |
| 17 | −161.47861 | −115.331 | | |
| 18 | −464.57044 | −30.000 | SiO$_2$ | |
| 19 | 321.57847 | −117.942 | | |
| 20 | 168.56869 | −11.811 | SiO$_2$ | |
| 21 | −251.33100 | −5.000 | | |
| 22 | −309.92623 | −30.000 | SiO$_2$ | |
| 23 | 501.06370 | −206.478 | | |
| 24 | −5948.04836 | −30.000 | SiO$_2$ | |
| 25 | 285.29345 | −0.081 | | |
| 26 | −534.73642 | −30.000 | SiO$_2$ | |
| 27 | 772.20352 | −0.100 | | |
| 28 | 0.00000 | −7.000 | SiO$_2$ | P |

Aspheric Surface Data
κ:1
A: 0.645652210378e-8   B: 0.254015221025e-13
C: 0.152056034342e-16   −0.158200516208e-20

| 28 | 0.00000 | −0.100 | | |
|---|---|---|---|---|
| 29 | 0.00000 | 267.300 | reflecting surface M2 | |
| 30 | 0.00000 | −346.376 | reflecting surface M3 | |
| 31 | −197.49176 | −30.000 | SiO$_2$ | B |
| 32 | 17530.15232 | −67.213 | | |
| 33 | 0.00000 | −5.000 | | S |
| 34 | 0.00000 | −7.000 | SiO$_2$ | Q |

Aspheric Surface Data
κ:1
A: 0.131370214487e-7   B: 0.333184500674e-12
C: 0.250435601016e-17   0.20950464532e-20

| 35 | 0.00000 | −0.100 | | |
|---|---|---|---|---|
| 36 | −147.90421 | −25.000 | SiO$_2$ | |
| 37 | −414.36719 | −69.235 | | |
| 38 | −91.80571 | −35.000 | SiO$_2$ | |
| 39 | −1272.56390 | −0.100 | | |
| 40 | −147.96775 | −15.000 | SiO$_2$ | |
| 41 | −63.01133 | −3.000 | | |
| 42 | −63.15395 | −43.894 | SiO$_2$ | |
| 43 | 772.99694 | −15.000 | | |
| 45 | 0.00000 | | | W |

As shown in FIG. 3, the effective diameters of the lenses used in the system are 170 or less, and the distance between the object and the image is 741. These values are about ¾ of those used in a conventional refractive and spherical-surface optical system under this specification. The number of lenses used in this optical system is kept equal or similar to that of the conventional system in spite of the fact that the effective diameter of the lens and the size of the entire system are reduced.

FIG. 4 shows the transverse aberration of the catadioptric optical system of the first embodiment, and FIG. 5 shows the astigmatism and the distortion of the same optical system. As it is clear from these figures, spherical aberration, coma, astigmatism, and distortion are effectively corrected to the extent of almost no aberrations, while a ultraviolet excimer laser having a short wavelength of 248 nm is used.

[Second Embodiment]

Figure 6:
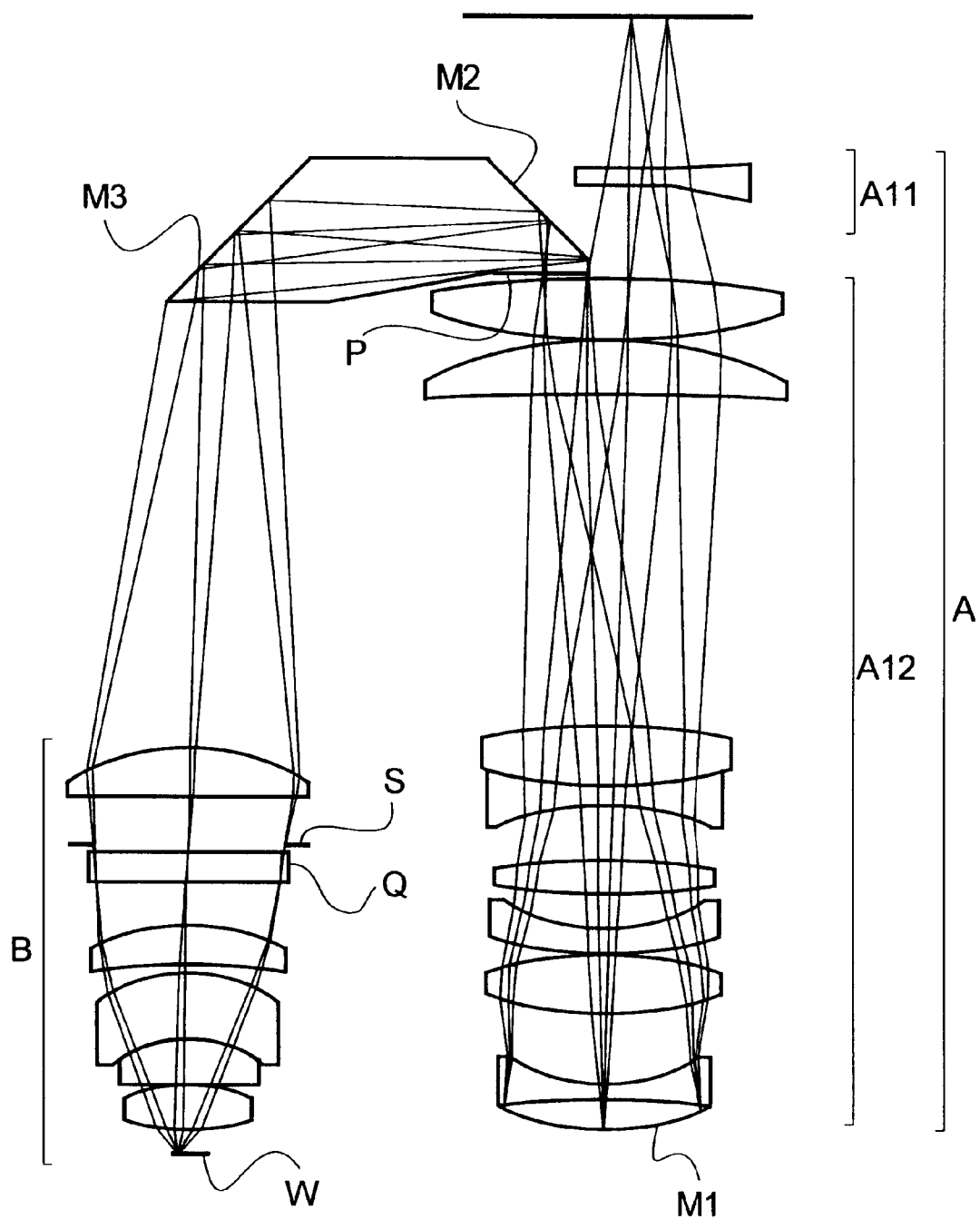
FIG. 6 is a ray diagram of the catadioptric optical system according to the second embodiment of the invention.
Figure 7A:
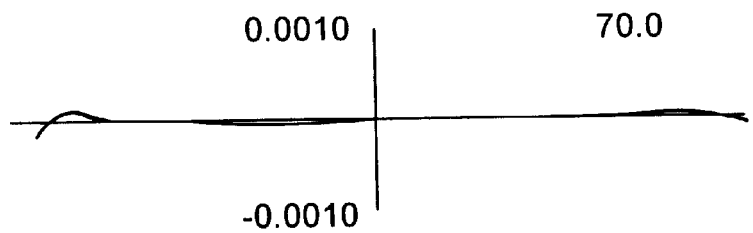
FIG. 7 shows the transverse aberration arising in the second embodiment.
Figure 7B:
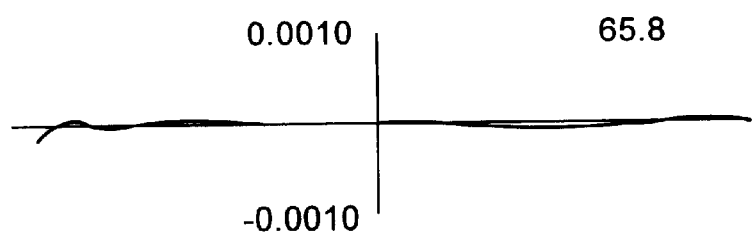
Figure 7C:
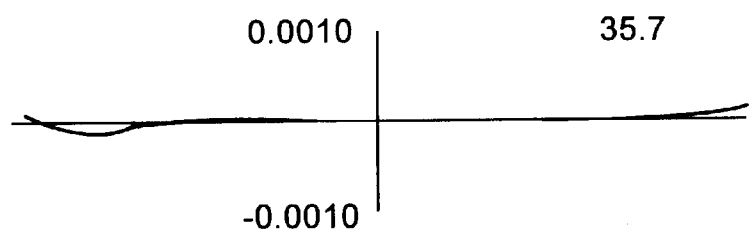
Figure 7D:
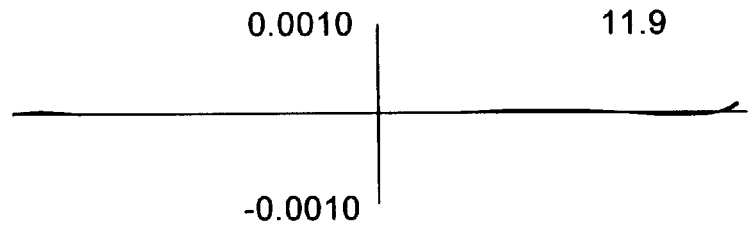

FIG. 6 is a ray diagram of the catadioptric optical system according to the second embodiment, and Table 2 lists the lens data of this optical system. In Table 2, the first column lists all the lens surfaces serially numbered, the second column is the radius of curvature of each lens surface, the third column is the distance to the next lens surface, and the fourth column indicates the glass material. Specific elements are denoted by the symbols used in this specification.

The catadioptric optical system of this embodiments has a first focusing lens system A which consists of a one-way lens system A11 comprising a refractive lens, and a double path lens system A12 comprising eight lenses and a concave mirror M1. A light-flux splitting prism is positioned after the first focusing lens system A. The light beam that left the first plane R passes through the elements of the first focusing lens system A in the order listed above, and the light-flux splitting prism. The light beam further passes through the second focusing lens system B which comprises five lenses, an aperture stop S, and a plane-parallel plate (i.e., a second aspheric element Q) having an aspheric surface and, finally, it reaches the wafer (i.e., the second plane) W. The incident surface of the light-flux splitting prism is ground into an aspheric surface. This prism functions as the first aspheric element P and, at the same time, it has the second and third reflecting surfaces M2 and M3.

The magnification of this optical system is ¼, the numerical aperture NA on the image side is 0.6, and the maximum object height is 70.0. This optical system has a rectangular aperture with an exposure size of 24×120, and the reticle pattern is exposed to the light beam, while the reticle is scanned with respect to the light beam.

TABLE 2

| NO. | r | d | glass material | | |
|---|---|---|---|---|---|
| 0 | 0.00000 | 97.329 | | R | |
| 1 | −852.84892 | 10.935 | SiO$_2$ | A | A11 |
| 2 | 427.78583 | 60.827 | | | |
| 3 | 663.60250 | 40.000 | SiO$_2$ | | A12 |
| 4 | −351.03784 | 0.081 | | | |
| 5 | 257.40324 | 34.550 | SiO$_2$ | | |
| 6 | 2438.07789 | 216.095 | | | |
| 7 | 502.34945 | 40.000 | SiO$_2$ | | |
| 8 | −262.00938 | 0.775 | | | |
| 9 | −244.76524 | 11.810 | SiO$_2$ | | |
| 10 | 159.40009 | 37.191 | | | |
| 11 | 953.44172 | 20.000 | SiO$_2$ | | |
| 12 | −747.74093 | 23.298 | | | |
| 13 | −127.21946 | 15.000 | SiO$_2$ | | |
| 14 | −225.24650 | 1.495 | | | |
| 15 | 270.26506 | 40.000 | SiO$_2$ | | |
| 16 | −212.42840 | 44.058 | | | |
| 17 | −136.12200 | 12.000 | SiO$_2$ | | |
| 18 | 300.22202 | 20.000 | | | |
| 19 | −209.22265 | −20.000 | reflecting surface M1 | | |
| 20 | 300.22202 | −12.000 | SiO$_2$ | | |
| 21 | −136.12200 | −44.058 | | | |
| 22 | −212.42840 | −40.000 | SiO$_2$ | | |
| 23 | 270.26506 | −1.495 | | | |
| 24 | −225.24650 | −15.000 | SiO$_2$ | | |
| 25 | −127.21946 | −23.298 | | | |
| 26 | −747.74094 | −20.000 | SiO$_2$ | | |
| 27 | 953.44172 | −37.191 | | | |
| 28 | 159.40009 | −11.810 | SiO$_2$ | | |
| 29 | −244.76524 | −0.775 | | | |
| 30 | −262.00938 | −40.000 | SiO$_2$ | | |
| 31 | 502.34945 | −216.095 | | | |
| 32 | 2438.07789 | −34.550 | SiO$_2$ | | |
| 33 | 257.40324 | −0.081 | | | |
| 34 | −351.03784 | −40.000 | SiO$_2$ | | |
| 35 | 663.60250 | −3.000 | | | |
| 36 | 0.00000 | 3.000 | SiO$_2$ | P | |

Aspheric Surface Data
κ: 1
A: 0.887390809767e-8   B: 0.169993245617e-13

TABLE 2-continued

| NO. | r | d | glass material |
|---|---|---|---|
| | C: −0.191633424206e-19 | −0.177186383906e-22 | |
| 37 | 0.00000 | 267.300 | reflecting surface M2 |
| 38 | 0.00000 | −16.200 | reflecting surface M3 |
| 39 | 0.00000 | −290.000 | |
| 40 | −147.64203 | −30.000 | SiO$_2$ |
| 40 | 191842.56390 | −32.911 | |
| 41 | 0.00000 | −5.000 | S |
| 42 | 0.00000 | −20.000 | SiO$_2$ Q |
| 43 | 0.00000 | −27.384 | |
| | Aspheric Surface Data | | |
| | κ: 1 | | |
| | A: 0.669401563554e-8 | B: 0.390599494004e-12 | |
| | C: 0.3 12995771257e-16 | 0.592108763547e-20 | |
| 45 | −135.93921 | −26.306 | SiO$_2$ |
| 46 | −499.74670 | 4.092 | |
| 47 | −107.66763 | 43.000 | SiO$_2$ |
| 48 | −64.44984 | −2.000 | |
| 49 | −66.18404 | −30.000 | SiO$_2$ |
| 50 | 574.11841 | −0.073 | |
| 51 | −114.99848 | −29.315 | SiO$_2$ |
| 52 | 252.71212 | −15.000 | |
| 53 | 0.00000 | | W |

As shown in FIG. 6, although the effective diameters of some lenses are about 220, the diameters of the other lenses are 150 or less, and the distance between the object and the image is 790, whereby a compact optical system is achieved. Thus, the effective diameter of the lenses and the size of the entire optical system can be reduced, while the number of lenses used in this optical system is almost equal to that of the conventional system.

Figure 8B:
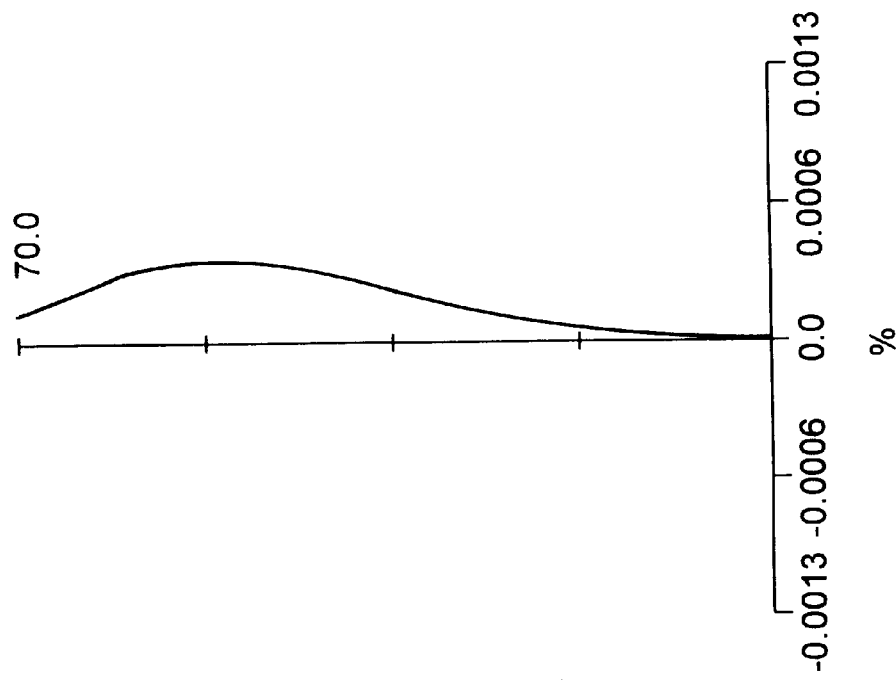
FIG. 8 shows the astigmatic field curvature and the distortion in the second embodiment.
Figure 8A:
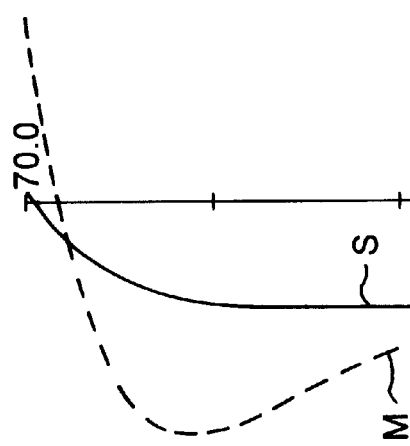
Figure 11A:
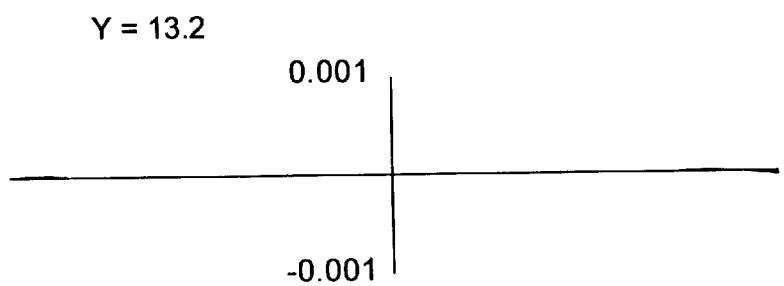
FIG. 11 shows the transverse aberration in the third embodiment.
Figure 11B:
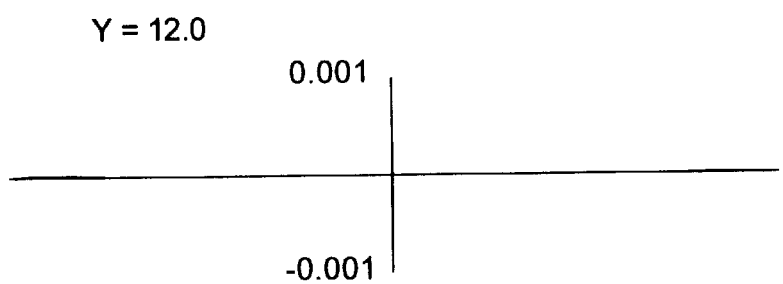
Figure 11C:
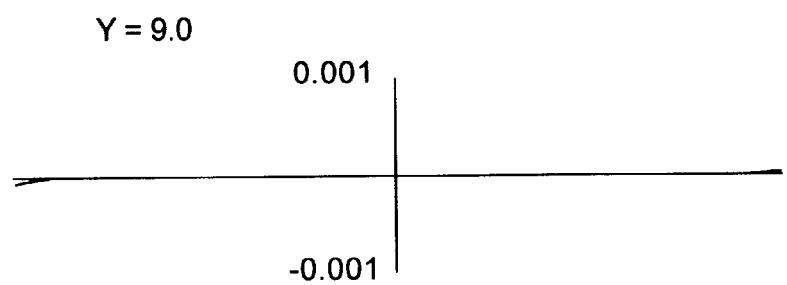
Figure 11D:
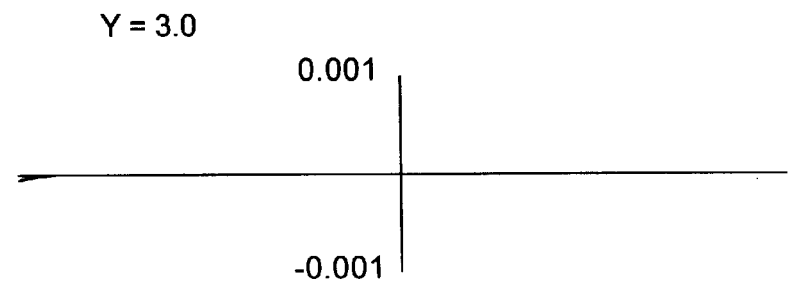

FIG. 7 shows the transverse aberration of the catadioptric optical system of the second embodiment, and FIG. 8 shows the astigmatism and the distortion of the same optical system. As is clear from these figures, spherical aberration, coma, astigmatism, and distortion are effectively corrected to the extent of almost no aberrations, while a ultraviolet excimer laser having a short wavelength of 248 nm is used.

Figure 12:
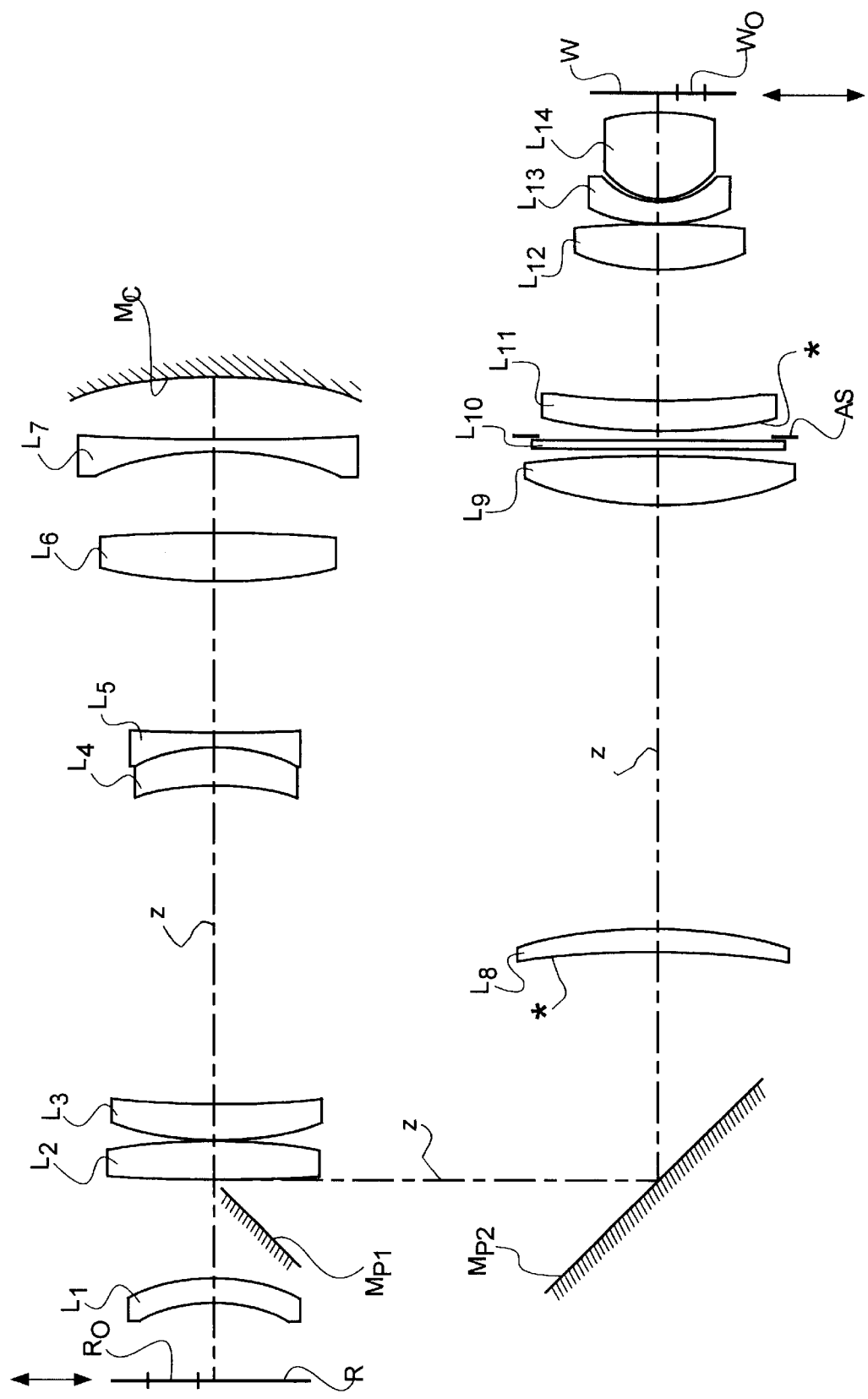
FIG. 12 shows the lens arrangement according to the fourth embodiment of the invention.
Figure 14A:
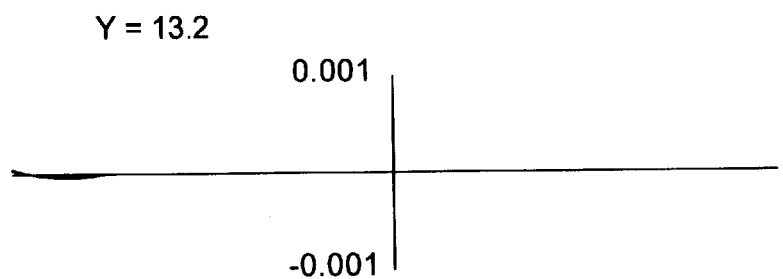
FIG. 14 shows the transverse aberration in the fourth embodiment.
Figure 14B:
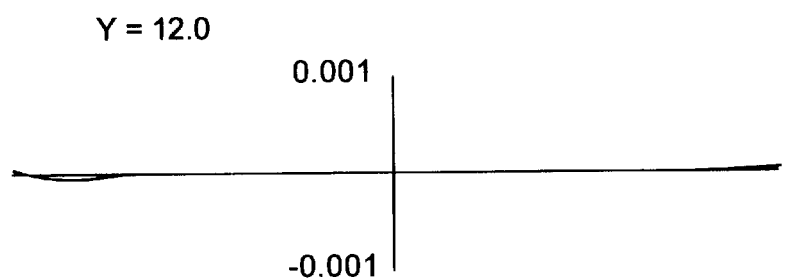
Figure 14C:
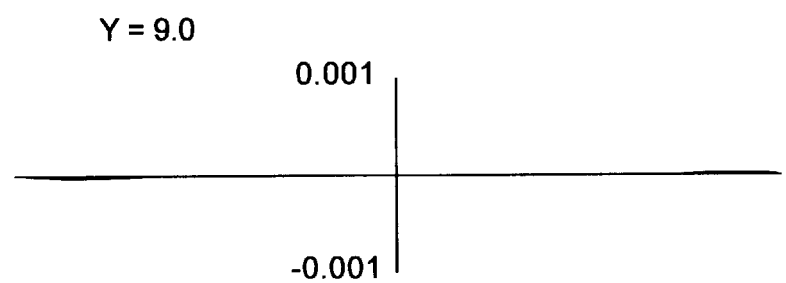
Figure 14D:
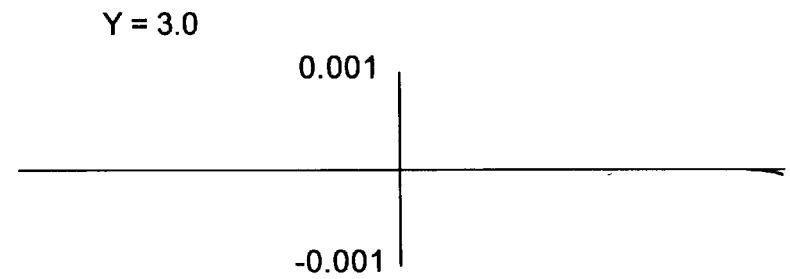
Figure 15:
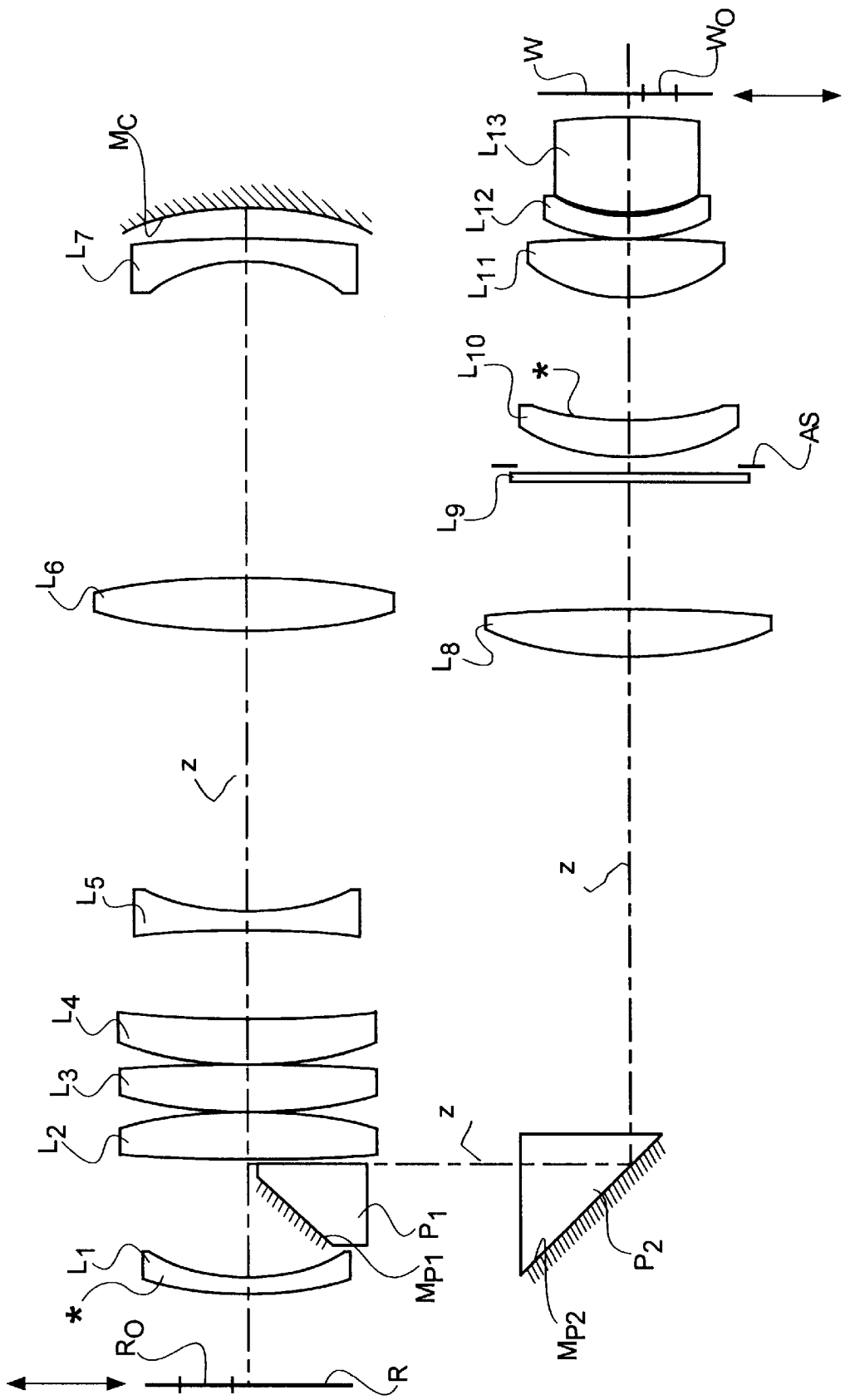
FIG. 15 shows the lens arrangement according to the fifth embodiment of the invention.
Figure 17A:
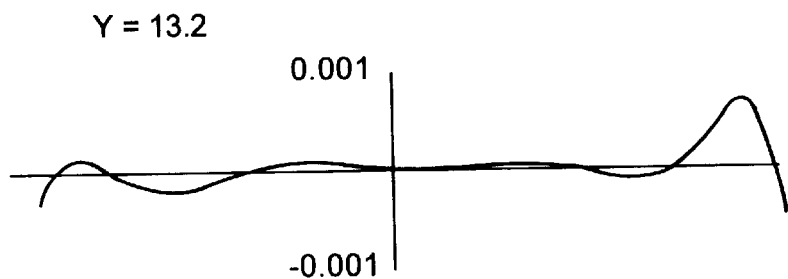
FIG. 17 shows the transverse aberration in the fifth embodiment.
Figure 17B:
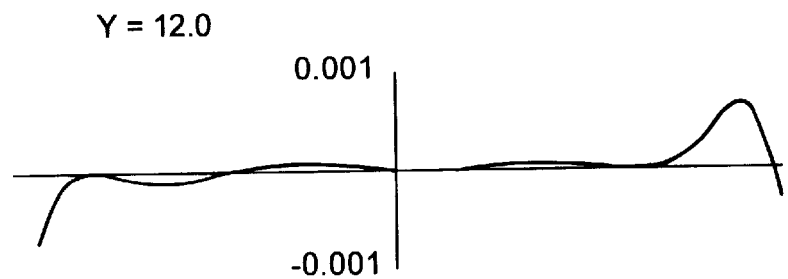
Figure 17C:
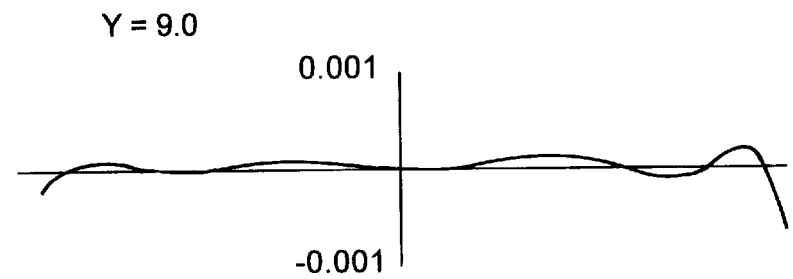
Figure 17D:
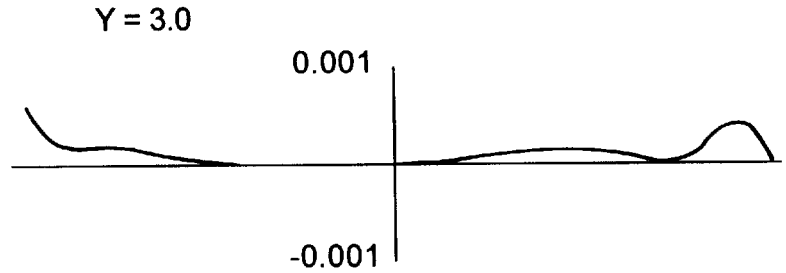

FIGS. 9, 12 and 15 illustrate the lens arrangement of the catadioptric optical systems according to the third, fourth and fifth embodiments. In the drawings, the asterisked surfaces are aspheric surfaces. In each embodiment, the first focusing lens system A comprises seven lenses L1 through L7 and a concave mirror Mc. A first reflecting surface $M_{p1}$ is positioned between lenses L1 and L2, and lenses L2 through L7 comprise a double path lens system. In the third and fourth embodiments, the second focusing lens system B comprises seven lenses L8 through L14, while, in the fifth embodiment, the second focusing lens system B comprises six lenses L8 through L13. Thus, the number of lenses used in the optical system of the present invention is relatively small.

The parameters that are in common through the third, fourth and fifth embodiments are listed below.

Maximum object height: 52.8;

Illumination area: rectangle defined by the length d of 45 and the width w of 16

Focusing magnification: ¼;

Maximum numerical aperture on the image side: 0.6;

In the third embodiment, the incident surface r31 of the prism, which serves as the second reflecting surface $M_{P2}$, and the incident surface r36 of lens L9 are aspheric. The former (r31) is used to compensate for the off-axis aberration, and the latter (r36) is used to compensate for the on-axis aberration.

In the fourth embodiment, the incident surface r30 of lens L5 and the incident surface r37 of lens L11 are aspheric. The former (r30) is used to compensate for the off-axis aberration, and the latter (r37) is used to compensate for the on-axis aberration.

In the fifth embodiment, the incident surface r1 of lens L1 and the incident surface r40 of lens L10 are aspheric. The former (r1) is used to compensate for the off-axis aberration, and the latter (r40) is used to compensate for the on-axis aberration.

Tables 3 through 5 list various parameters of the third through fifth embodiments. In the "lens parameter", the first column (No.) denotes the optical surfaces serially numbered from the reticle R, the second column (r) denotes the radius of curvature of each optical surface, the third column (d) denotes the distance to the next optical surface along the optical axis, and the fourth column denotes the optical elements used in the optical system. In the third column, each time the light flux is reflected by an optical surface, the sign changes. For example, the first negative sign indicate the first reflection.

In the embodiments, all of the lenses and the prisms are made of synthetic quartz (SiO$_2$).

The asterisked surfaces in the first column are aspheric surfaces, and the corresponding "r" values in the second column are vertex radius of curvature. The shape of the aspheric surface is expressed as $$z(y) = \frac{y^2/r}{1+(1-(1+\kappa)y^2/r^2)^{1/2}} + Ay^4 + By^6 + Cy^8 + Dy^{10}$$

where y is the height from the optical axis, z is the distance along the optical axis from the nodal plane to the aspheric surface, r is the vertex radius of curvature, κ is the conic coefficient, and A, B, C and D are aspheric coefficients.

"ASPHERIC SURFACE DATA" shows the actual values of the conical coefficient κ and the aspheric coefficients A through D of each aspheric surface.

The values h/φ set in equations (1) and (2) which define the aspheric surfaces are also listed in each embodiment.

TABLE 3

[MAJOR PARAMETERS]

Maximum Lens Diameter: 200
Designated Wavelength: 193.3 nm (ArF Laser Beam)
Index of Refraction of SiO$_2$: 1.56033

[LENS PARAMETERS]

| No. | r | d | |
|---|---|---|---|
| 0 | ∞ | 60.294148 | R |
| 1 | −1526.67795 | 20.000000 | L1 |
| 2 | 1449.97750 | 62.130010 | |
| 3 | 280.00112 | 30.000000 | L2 |
| 4 | −446.77307 | 0.081000 | |
| 5 | 230.54021 | 30.000000 | L3 |
| 6 | 550.13665 | 58.696803 | |
| 7 | −203.01616 | 30.000000 | L4 |
| 8 | −214.14255 | 12.248489 | |
| 9 | −955.77641 | 11.809800 | L5 |
| 10 | 133.34638 | 270.558687 | |
| 11 | 403.87615 | 40.000000 | L6 |
| 12 | −437.12875 | 101.737925 | |
| 13 | −215.39528 | 12.000000 | L7 |

TABLE 3-continued

| | | | |
|---|---|---|---|
| 14 | 639.9880 | 31.071393 | |
| 15 | -318.25906 | -31.071393 | Mc |
| 16 | 639.98880 | -12.000000 | L7 |
| 17 | -215.39528 | -101.737925 | |
| 18 | -437.12875 | -40.000000 | L6 |
| 19 | 403.87615 | -270.558687 | |
| 20 | 133.34638 | -11.809800 | L5 |
| 21 | -955.77641 | -12.248489 | |
| 22 | -214.14255 | -30.000000 | L4 |
| 23 | -203.01616 | -58.696803 | |
| 24 | 550.13665 | -30.000000 | L3 |
| 25 | 230.54021 | -0.081000 | |
| 26 | -446.77307 | -30.000000 | L2 |
| 27 | 280.00112 | -2.000000 | |
| 28 | ∞ | 0.000000 | P1 |
| 29 | ∞ | 75.000000 | P1 $M_{P1}$ |
| 30 | ∞ | 100.000000 | |
| *31 | ∞ | 80.000000 | P2 |
| 32 | ∞ | -30.000000 | P2 $M_{P2}$ |
| 33 | ∞ | -124.160437 | |
| 34 | 438.80649 | -20.000000 | L8 |
| 35 | 263.16854 | -396.697269 | |
| *36 | -230.13518 | -40.000000 | L9 |
| 37 | 814.05788 | -3.000000 | |
| 38 | ∞ | -7.000000 | L10 |
| 39 | ∞ | -5.000000 | |
| 40 | — | -5.000000 | AS |
| 41 | -219.51520 | -25.000000 | L11 |
| 42 | -379.75247 | -92.397952 | |
| 43 | -151.54127 | -35.000000 | L12 |
| 44 | 1059.58854 | -0.100000 | |
| 45 | -295.55283 | -15.000000 | L13 |
| 46 | -91.33043 | -3.000000 | |
| 47 | -80.70974 | -53.946695 | L14 |
| 48 | 772.99694 | -15.000000 | |
| 49 | ∞ | | W |

[ASPHERIC SURFACE DATA]

No. 31  κ = 0.0  A = 0.145731*10$^{-7}$  B = 0.199536*10$^{-12}$
                 C = 0.1410879*10$^{-17}$  D = 0.893412*10$^{-22}$
No. 36  κ = 0.0  A = 0.923179*10$^{-8}$  B = 0.127515*10$^{-12}$
                 C = 0.105395*10$^{-17}$  D = 0.577786*10$^{-23}$

[CONDITIONAL VALUES]

No. 31  h/φ = 0.247
No. 36  h/φ = 1.06

TABLE 4

[MAJOR PARAMETERS]

Maximum Lens Diameter: 203
Designated Wavelength: 193.3 nm (ArF Laser Beam)
Index of Refraction of SiO$_2$: 1.56033

[LENS PARAMETERS]

| No. | r | d | |
|---|---|---|---|
| 0 | ∞ | 60.000000 | R |
| 1 | -135.08483 | 20.000000 | L1 |
| 2 | -144.69488 | 19.177067 | |
| 3 | 2682.45981 | 30.000000 | L2 |
| 4 | -672.01329 | 0.081000 | |
| 5 | 212.44717 | 30.000000 | L3 |
| 6 | 490.44519 | 259.743260 | |
| 7 | -219.62863 | 30.000000 | L4 |
| 8 | -131.45211 | 0.999335 | |
| 9 | -129.09721 | 11.809800 | |
| 10 | 6031.32857 | 122.360511 | |
| 11 | 475.14499 | 40.000000 | L6 |
| 12 | -1424.45865 | 65.677735 | |
| 13 | -233.33359 | 12.000000 | L7 |
| 14 | 8563.54526 | 44.093181 | |

TABLE 4-continued

| | | | |
|---|---|---|---|
| 15 | -323.42546 | -44.093181 | Mc |
| 16 | 8563.54521 | -12.000000 | L7 |
| 17 | -233.33359 | -65.677735 | |
| 18 | -1424.45865 | -40.000000 | L6 |
| 19 | 475.14499 | -122.360511 | |
| 20 | 6031.32857 | -11.809800 | L5 |
| 21 | -129.09721 | -0.999335 | |
| 22 | -131.45211 | -30.000000 | L4 |
| 23 | -219.62863 | -259.743260 | |
| 24 | 490.44519 | -30.000000 | L3 |
| 25 | 212.44717 | -0.08100 | |
| 26 | -672.01329 | -30.000000 | L2 |
| 27 | 2682.45981 | -2.000000 | |
| 28 | ∞ | 350.000000 | $M_{P1}$ |
| 29 | ∞ | 127.144770 | $M_{P2}$ |
| *30 | 1265.63351 | -20.000000 | L8 |
| 31 | 408.37355 | -345.780841 | |
| 32 | -252.73915 | -39.460139 | L9 |
| 33 | 624.67553 | -3.000000 | |
| 34 | ∞ | -7.000000 | L10 |
| 35 | ∞ | -5.000000 | |
| 36 | — | -5.000000 | AS |
| *37 | -395.20617 | -25.000000 | L11 |
| 38 | -961.87755 | -104.427799 | |
| 39 | -213.90964 | -35.000000 | L12 |
| 40 | 525.59659 | -0.100000 | |
| 41 | -191.38031 | -15.000000 | L13 |
| 42 | -55.73158 | -3.000000 | |
| 43 | -56.54191 | -63.949341 | L14 |
| 44 | 772.99694 | -15.000000 | |
| 45 | ∞ | | W |

[ASPHERIC SURFACE DATA]

No. 30  κ = 0.0  A = 0.835943*10$^{-8}$  B = 0.991936*10$^{-14}$
                 C = 0.122218*10$^{-18}$  D = 0.113066*10$^{-22}$
No. 37  κ = 0.0  A = 0.285566*10$^{-7}$  B = 0.752392*10$^{-12}$
                 C = 0.850071*10$^{-17}$  D = 0.988694*10$^{-22}$

[CONDITIONAL VALUES]

No. 30  h/φ = 0.806
No. 37  h/φ = 0.988

TABLE 5

[MAJOR PARAMETERS]

Maximum Lens Diameter: 186
Designated Wavelength: 248.4 nm (KrF Laser Beam)
Index of Refraction of SiO$_2$: 1.50839

[LENS PARAMETERS]

| No. | r | d | |
|---|---|---|---|
| 0 | ∞ | 61.584337 | R |
| *1 | 226.39961 | 10.935000 | L1 |
| 2 | 133.58099 | 65.542159 | |
| 3 | 1169.30409 | 30.000000 | L2 |
| 4 | -551.89220 | 0.081000 | |
| 5 | 361.25428 | 30.000000 | L3 |
| 6 | -5943.81418 | 0.100000 | |
| 7 | 225.16771 | 30.000000 | L4 |
| 8 | 682.33656 | 61.389241 | |
| 9 | -507.86321 | 11.809800 | L5 |
| 10 | 183.65506 | 185.393182 | |
| 11 | 301.09677 | 40.000000 | L6 |
| 12 | -378.84696 | 203.117577 | |
| 13 | -110.24174 | 12.000000 | L7 |
| 14 | -747.82409 | 20.000000 | |
| 15 | -267.35110 | -20.000000 | Mc |
| 16 | -747.82409 | -12.000000 | L7 |
| 17 | -110.24174 | -203.117577 | |
| 18 | -378.84696 | -40.000000 | L6 |
| 19 | 301.09677 | -185.393182 | |

TABLE 5-continued

| | | | |
|---|---|---|---|
| 20 | 183.65506 | −11.809800 | L5 |
| 21 | −507.86321 | −61.389241 | |
| 22 | 682.33556 | −30.000000 | L4 |
| 23 | 225.16771 | −0.100000 | |
| 24 | −5943.81418 | −30.000000 | L3 |
| 25 | 361.25428 | −0.081000 | |
| 26 | −551.89220 | −30.000000 | L2 |
| 27 | 1169.30409 | −2.000000 | |
| 28 | ∞ | 0.000000 | P1 |
| 29 | ∞ | 75.000000 | P1 $M_{P1}$ |
| 30 | ∞ | 100.000000 | |
| 31 | ∞ | 75.000000 | P2 |
| 32 | ∞ | −20.000000 | P2 $M_{P2}$ |
| 33 | ∞ | −315.366289 | |
| 34 | −231.46059 | −30.000000 | L8 |
| 35 | 1966.65571 | −84.633711 | |
| 36 | ∞ | −7.000000 | L9 |
| 37 | ∞ | −5.000000 | |
| 38 | — | −5.000000 | AS |
| 39 | −139.80277 | −25.000000 | L10 |
| *40 | −262.46968 | −80.730669 | |
| 41 | −109.21668 | −35.000000 | L11 |
| 42 | 1305.58094 | −0.100000 | |
| 43 | −105.84460 | −15.000000 | L12 |
| 44 | −80.65665 | −3.000000 | |
| 45 | −100.21210 | −58.387047 | L13 |
| 46 | 772.99694 | −15.000000 | |
| 47 | ∞ | | W |

[ASPHERIC SURFACE DATA]

No. 1  $\kappa = 0.0$   $A = 0.115668*10^{-6}$   $B = 0.122080*10^{-11}$
              $C = 0.111312*10^{-15}$   $D = 0.863596*10^{-20}$
No. 40 $\kappa = 0.0$   $A = 0.568027*10^{-7}$   $B = 0.120518*10^{-11}$
              $C = 0.559783*10^{-16}$   $D = 0.842298*10^{-21}$

[CONDITIONAL VALUES]

No. 1  $h/\phi = 0.131$
No. 40 $h/\phi = 0.928$

FIG. 10 shows the spherical aberration, the astigmatism, and the distortion arising the third embodiment, and FIG. 11 shows the transverse aberration of the third embodiment. Similarly, FIGS. 13 and 14 show the same aberrations in the fourth embodiment, and FIGS. 16 and 17 show the same aberrations in the fifth embodiment. In the aberration diagrams, NA denotes the numerical aperture on the image side, and Y denotes the image height. In the astigmatism, the solid line indicates the sagittal image plane, and the dashed line indicates the meridian image plane. As it is clear from these aberration diagrams, the optical system of each embodiment exhibits a superior image quality.

ADVANTAGES OF THE INVENTION

In the present invention, the optical surface in which the height of the beam emitted from the object has a close relation with the beam height that intersects with this surfaces, is made aspheric, whereby the off-axis aberrations, including distortion, are compensated without affecting the on-axis aberrations, such as spherical aberration. In addition, the optical surface, in which the numerical aperture of the beam emitted from the object has a close relation with the beam height that passes through this surface, is made aspheric, whereby the on-axis aberrations, including spherical aberration, are compensated without affecting the off-axis aberrations, such as distortion.

In this arrangement, the problems in the conventional catadioptric optical system are eliminated, and a compact and high-quality optical system can be provided with a reduced number of lenses.

Although the invention has been described by way of exemplary embodiments, it should be understood that many changes and substitutions may be made by those skilled in the art without departing from the spirit and the scope of the invention which is defined only by the appended claims.

What is claimed is:

1. A catadioptric optical system comprising:

a first focusing lens system including a concave mirror, for forming an intermediate image of a first plane;

a second focusing lens system including an aperture stop, for forming a refocused image of said intermediate image onto a second plane;

a reflecting surface for guiding a light flux from the first focusing lens system to the second focusing lens system;

wherein at least one of lens surfaces satisfy the condition:

$$h/\phi < 0.85 \quad (1)$$

and at least one of lens surfaces satisfy the condition:

$$0.85 < h/\phi < 1.2 \quad (2)$$

where h is a height at the lens surface of a light beam emitting from an intersection of an optical axis of the first plane and passing through the lens surfaces with a maximum numerical aperture, and $\phi$ is a radius of a diaphragm of the aperture stop; and wherein at least one of the lens surfaces that satisfy the condition (1) and at least one of the lens surfaces that satisfy the condition (2) are aspheric.

2. The catadioptric optical system according to claim 1, wherein at least one lens is positioned between the reflecting surface and the concave mirror, for passing light flux advancing toward the concave mirror along a forward path and light flux reflected from the concave mirror along a return path.

3. The catadioptric optical system according to claim 1, further comprising a second reflecting surface between said reflecting surface and the aperture stop so that an optical axis of the first plane and an optical axis of the second plane become parallel to each other.

4. The catadioptric optical system according to claim 2, further comprising a second reflecting surface between said reflecting surface and the aperture stop so that an optical axis of the first plane and an optical axis of the second plane become parallel to each other.

5. A catadioptric optical system, comprising:

a first focusing lens system including a concave mirror, for forming an intermediate image of a first plane;

a second focusing lens system including an aperture stop, for forming a refocused image of said intermediate image onto a second plane;

a reflecting surface for guiding a light flux from the first focusing lens system to the second focusing lens system;

a first aspheric element placed near the intermediate image; and a second aspheric element placed near the concave mirror.

6. The catadioptric optical system according to claim 5, wherein the concave mirror is forming the second aspheric element.

7. The catadioptric optical system according to claim 5, wherein the first focusing lens system comprises a one-way lens system for passing only a forward light beam which is being incidental to the concave mirror, and a double-path lens system for passing both the forward light beam incidental to the concave mirror and a return light beam reflected by the concave mirror.

8. The catadioptric optical system according to claim 7, wherein the one-way lens system has a negative refractive power.

9. The catadioptric optical system according to claim 5, wherein an aspheric surface of the first aspheric element is formed in a plane, and an aspheric surface of the second aspheric element is formed in a plane.

10. The catadioptric optical system according to claim 5, wherein the first aspheric element is a plane-parallel plate and the second aspheric element is a plane-parallel plate.

11. The catadioptric optical system according to claim 5, further comprising a second reflecting surface placed in vicinity of the plane on which the intermediate image is formed, in order to deflect an optical path.

12. The catadioptric optical system according to claim 11, wherein a third reflecting surface is placed between the second reflecting surface and the second focusing lens system in order to deflect the optical path, and the first plane and the second plane are arranged parallel to each other.

13. The catadioptric optical system according to claim 12, wherein the first aspheric element is a prism, and the second aspheric element is a plane-parallel plate.

14. The catadioptric optical system according to claims 9, wherein the aspheric surface of the first aspheric element is rotationally symmetric, and the aspheric surface of the second aspheric element is rotationally symmetric.

15. The catadioptric optical system according to claims 9, wherein the aspheric surface of the first aspheric element is perfectly asymmetric, and the aspheric surface of the second aspheric element is rotationally symmetric.

16. The catadioptric optical system according to claims 9, wherein an aspheric surface of the first aspheric element is toric, and the aspheric surface of the second aspheric element is rotationally symmetric.

17. The catadioptric optical system, comprising:
 a first focusing lens system including a concave mirror, for forming an intermediate image of a first plane;
 a second focusing lens system including an aperture stop, for forming a refocused image of said intermediate image onto a second plane;
 a reflecting surface placed near the intermediate image for guiding a light beam from the first focusing lens system to the second focusing lens system;
 a first aspheric element placed near the intermediate image; and
 a second aspheric element placed near the aperture stop.

18. The catadioptric optical system according to claim 17, wherein said first focusing system includes a one-way lens system with a negative refractive power for passing a forward light beam to the concave mirror, and a double-path lens system for passing the forward light beam to the concave mirror and a return light beam reflected from the concave mirror.

19. The catadioptric optical system according to claim 17, wherein an aspheric surface of the first aspheric element is formed in a plane, and an aspheric surface of the second aspheric element is formed in a plane.

20. The catadioptric optical system according to claim 17, wherein the first aspheric element is a plane-parallel plate and the second aspheric element is a plane-parallel plate.

21. The catadioptric optical system according to claim 18, further comprising a second reflecting surface placed in vicinity of the plane on which the intermediate image is formed, in order to deflect an optical path.

22. The catadioptric optical system according to claim 21, further comprising a third reflecting surface placed between the second reflecting surface and the aperture stop, wherein said first plane and said second plane are arranged parallel to each other.

23. The catadioptric optical system according to claim 19, wherein the first aspheric element is a prism, and the second aspheric element is a plane-parallel plate.

* * * * *